United States Patent [19]

Evans et al.

[11] Patent Number: 5,996,097
[45] Date of Patent: Nov. 30, 1999

[54] TESTING LOGIC ASSOCIATED WITH NUMEROUS MEMORY CELLS IN THE WORD OR BIT DIMENSION IN PARALLEL

[75] Inventors: Donald Evans, Williston, Vt.; Luigi Ternullo, Jr., San Jose, Calif.

[73] Assignee: International Business Machines Corporation, Armonk, N.Y.

[21] Appl. No.: 08/847,612

[22] Filed: Apr. 28, 1997

[51] Int. Cl.[6] .......................... G11C 29/00; G11C 7/00
[52] U.S. Cl. ..................... 714/719; 714/71; 365/201
[58] Field of Search ..................... 371/21.1, 21.2, 371/22.1, 22.31, 24, 25.1, 67.1, 68.1, 68.2, 71; 365/201, 200, 189.04, 189.05, 189.07, 189.08, 189.12; 714/718, 719, 724, 725, 726, 735, 736, 820, 821, 824

[56] References Cited

U.S. PATENT DOCUMENTS

| | | | |
|---|---|---|---|
| 3,761,902 | 9/1973 | Weinberger | 365/189.08 |
| 4,752,929 | 6/1988 | Kantz et al. | 371/21.2 |
| 4,885,748 | 12/1989 | Hoffman et al. | 371/21.3 |
| 5,060,230 | 10/1991 | Arimoto et al. | 371/21.2 |
| 5,072,178 | 12/1991 | Matsumoto | 371/22.1 |
| 5,185,722 | 2/1993 | Ota et al. | 365/201 |
| 5,265,100 | 11/1993 | McClure et al. | 371/21.2 |
| 5,311,473 | 5/1994 | McClure et al. | 365/201 |
| 5,313,424 | 5/1994 | Adams et al. | 365/200 |
| 5,406,566 | 4/1995 | Obara | 371/21.2 |
| 5,553,082 | 9/1996 | Connor et al. | 371/22.31 |
| 5,592,425 | 1/1997 | Neduva | 365/201 |
| 5,673,270 | 9/1997 | Tsujimoto | 371/21.1 |

OTHER PUBLICATIONS

Peter L. Gardner, Functional Memory and Its Microgramming, vol. C–20, No. 7, Jul., 1971.
J.P. Bartlett, Processing Memories, Jun. 16–18, 1970.
Sven E. Wahlstrom, Programmable Logic Arrays–Cheaper by the Millions, Dec. 11, 1967.

*Primary Examiner*—Trinh L. Tu
*Attorney, Agent, or Firm*—Schmeiser, Olsen & Watts; Robert A. Walsh

[57] ABSTRACT

The present invention is a system and method of testing logic circuits in memory of an integrated circuit in a fraction of the time. The present invention discloses a system and method to allow testing imbedded array logic blocks in parallel, rather than sequentially. The present invention allows for the testing of multiple logic blocks associated with different memory or column locations at the same time. This technique allows for reduction in test time by a factor of X, where X is the number of rows or columns or memory cells feeding logic.

14 Claims, 2 Drawing Sheets

TESTING LOGIC ASSOCIATED WITH NUMEROUS MEMORY CELLS IN THE WORD OR BIT DIMENSION IN PARALLEL

TECHNICAL FIELD

This invention relates to semiconductor memories, and more specifically relates to special test modes to test logic circuits for such memories.

BACKGROUND ART

In modem high density memories, such as random access memories (RAMs) having $2^{20}$ bits of memory or more, the time and equipment required to test functionality and timing of all bits in the memory constitutes a significant portion of the manufacturing cost. Accordingly, as the time required for such testing increases, the manufacturing costs also increase. Similarly, if the time required for the testing of the memory can be reduced, the manufacturing cost of the memories is similarly reduced. Since the manufacturing of memory devices is generally done in high volume, the savings of even a few seconds per device can result in significant cost reduction and capital avoidance, considering the high volume of memory devices produced.

Random access memories (RAMs) are especially subject to having significant test costs, not only because of the necessity of both writing data to and reading data from each of the bits in the memory, but also because as the density of RAM devices increases, the time required to test each bit of each device in production increases at a rapid rate.

Imbedded in these high density memories are logic circuits which are difficult to test for the same reasons. Imbedded logic circuits are gating or switching circuits which perform such logical operations as AND, NAND, NOR, and OR on the memory cells. The logic cells or circuitry are interweaved within the memory arrays to control access to the memory.

Very large and complex process/logic chip designs require the ability to test and observe the output of partitioned logic blocks. A known solution to the problem of testing imbedded arrays includes testing the imbedded array logic blocks sequentially. Also, a solution which has been used in the past to reduce the time and equipment required for the testing of logic designs is the use of special "test" modes, where the circuit enters a special operation different from its normal or functional operation.

SUMMARY OF THE INVENTION

In accordance with the present invention there is disclosed is a method of parallel testing a plurality of logic circuits embedded in a memory array in an integrated circuit comprising: selecting a plurality of logic circuits; writing in parallel to the plurality of logic circuits; and comparing a resultant output to an expected output.

In accordance with the present invention there is disclosed a semiconductor memory device having a function of testing its imbedded logic though parallel access to the imbedded logic comprising: a plurality of memory cell arrays; imbedded logic in said plurality of memory cell arrays; a plurality of word line driver circuits for turning on the memory cell arrays; and a plurality of observation latches which capture the output of the imbedded logic.

The present invention is a system and method of testing multiple groups of logic associated with a non-scannable memory. Non-scannable memory is made up of memory cells without a scan in port. As a result, testing non-scannable memory requires applying patterns to it. The memory inputs feed a single row or column of memory cells at any one time in functional operation. Therefore, functionally only one row or column of memory cells can be accessed at a time to feed the single block of logic it is associated with. Operating this type of memory and logic configuration as in functional mode to test the logic requires X times as many machine cycles to test with X being the number of rows or columns that feed blocks of logic.

The problem solved by the present invention is the reduction of testing time to test multiple blocks of identical or mixed logic that are fed by different memory cells. This is accomplished by turning on all the word lines or bit lines, whichever the case may be, and, if necessary, slightly increasing the size of the write drivers to write multiple cells in a RAM at the same time. By turning on the word lines or bit lines, this makes the memory elements transparent from a logic point of view. For example, the Block Address Translations (BAT) buffer has four word lines with four 48 bit comparators. Using the technique of the present invention, the four comparators can be tested in parallel, reducing the test time by a factor of four.

The present invention is a system and method of testing Block Address Translations (BAT) registers or similar non-scannable register/logic combinations in a fraction of the time by testing embedded array logic blocks in parallel, rather than sequentially.

In accordance with the present invention it has been discovered a system and method of testing very large and complex process/logic chip designs.

The present invention allows for the testing of multiple logic blocks associated with different memory or column locations at the same time.

The present invention allows for reduction in test time by a factor of X, where X is the number of rows or columns of memory cells feeding logic.

It is therefore an advantage of the present invention to provide a test circuit and method which minimizes test time, minimizes the complexity, minimizes the area of additional "test" circuitry, and maximizes the diagnosability.

It is a further advantage of the present invention to simplify the built-in-self-test (BIST) function state.

It is a further advantage of the present invention to require very little area.

It is a further advantage of the present invention that it is a very simple way to test.

It is a further advantage of the present invention to allow testing imbedded array logic blocks in parallel, rather than sequentially.

DESCRIPTION OF THE PREFERRED EMBODIMENTS

Figure 1:
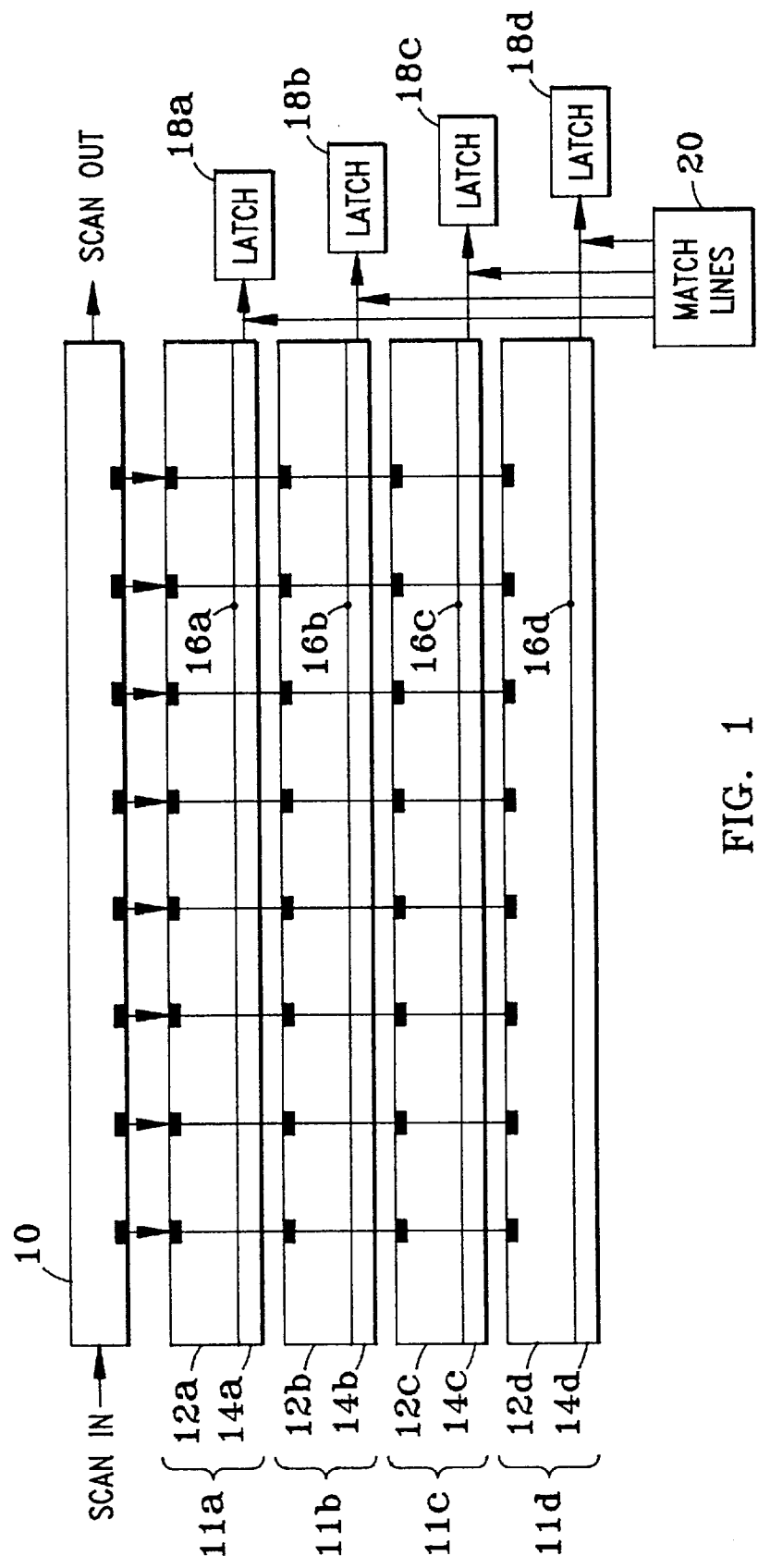
FIG. 1 discloses a Block Address Translation (BAT) register configuration.

It should be noted that the circuits in the drawings have P-channel field effect transistors (PFETs) indicated by a rectangle with a diagonal line formed within the rectangle and with a line adjacent and parallel to one side of the rectangle indicating the gate or control electrode of the transistor, and N-channel field effect transistors (NFETs) indicated simply by a rectangle without the diagonal line and with a line adjacent and parallel to one side of the rectangle indicating the gate or control electrode of the transistor.

In the following disclosure, the term normal operation or functional mode refers to everyday operation and test mode refers to a special test operation.

A BAT register configuration is schematically illustrated in FIG. 1. The BAT register is essentially a content addressable memory (CAM) whose memory locations or cells are readable. Reference numeral 10 represents 64 scannable latches. The scannable latches 10 are tied to four of the BAT registers 11a, 11b, 11c, and 11d which each contain a 64 bit memory cell register (12a, 12b, 12c, and 12d) and a 48 bit comparator (14a, 14b, 14c, and 14d). The scannable latches 10 scan test patterns into the memory cell registers 12a–12d. Embedded throughout the BAT registers 11a–11d are logic circuits 16a, 16b, 16c, and 16d which control the masking and unmasking of the cells or bits in the memory. The output of the comparators 14a–14d are tied to the match lines 20 and locked in at observable latches 18a, 18b, 18c, and 18d to determine if the logic circuits 16a–16d and comparators 14a–14d are functioning properly. The observable latches 18a–18d will store the test mode outputs. The match lines 20 logically signify whether an applied address matches any of the addresses stored in the BAT registers 11a –11d. The resulting match lines 20 are latched into the observable latches 18a–18d which allow the test mode outputs to be scanned out to be verified.

Figure 2:
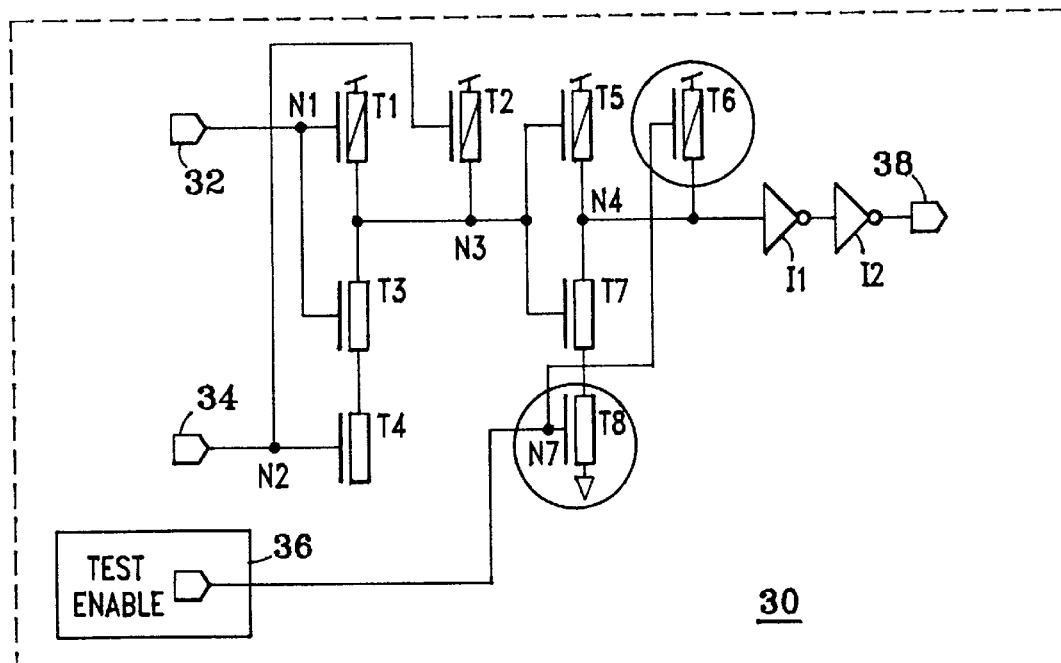
FIG. 2 discloses a Word Line Driver Circuit.

FIG. 2 schematically illustrates a word line driver circuit 30 with additional devices T6 and T8 for turning on all the word lines in the test mode. Four wordline drivers, one of which is shown in FIG. 2, are used in the present application to access the four BAT registers 11a–11d. The word line driver circuit 30 contains a word line address input 32, an enable address input 34, and circuit output 38 which is the word line driver. The word line address input 32 is connected to node N1. Node N1 is connected to the gate of P-channel transistor T1 and the gate of N-channel transistor T3. Transistor T1 is coupled between the supply voltage and node N3. T3 is also connected to node N3. The enable address 34 provides a control signal to node N2 which is connected to the gate of N-channel transistor T4 and the gate of P-channel transistor T2. Transistor T4 is coupled between the ground potential and transistor T3. Transistor T2 is connected between the supply voltage and node N3. Node N3 is connected to the gates of P-channel transistor T5 and N-channel transistor T7. Transistor T5 is coupled between the supply voltage and node N4. Transistor T7 is coupled between transistor T8 and node N4. Node N4 is connected through inverter amplifiers I1 and I2 to the word line driver output 38. Test enable 36 is connected to node N7. Node N7 is connected to the gate of transistor T8 and the gate of transistor T6.

In functional operation, the test enable 36 is high which turns T8 and T6 off. If it is a write cycle, the address input 32 and enable address input 34 pulse which causes the word line driver 38 to pulse. With four word line driver circuits 30, four orthogonal address inputs are used to select which of four word lines is to pulse. One enable address 34 is connected to all four word line driver circuits 30. In test mode, the test enable 36 is low which turns on T6 and T8 and causes all four word lines to go high. In this state, test data or patterns from the scannable registers 10 are written to all four rows of memory cells 12a–12d which in turn are connected to the comparators 14a–14d and embedded logic 16a–16d.

Referring to FIG. 1, the BAT registers 11a–11d and comparators 14a–14d function in the following manner in test mode. Stored addresses in each of the word line register cells in memory cell registers 12a–12d are compared through the comparators 14a–14d with a chosen address to look for a match. Some additional added functions in the compare logic includes logic to validate the match signal (V) and logic to selectively disregard a select group of memory cells (bit masking lines). The four orthogonal word lines (shown in FIG. 2) are used to write to the memory cells in the memory cell registers 12a–12d in function mode. To reduce the test time of the comparators 14a–14d, imbedded logic 16a–16d, and other associated logic, a test mode is used to activate all four of the word lines to update memory cell registers 12a–12d simultaneously. To accomplish this the four word lines in the BAT registers are orthogonal in functional mode and thus the design change had to be incorporated to turn on all of the word lines during the testing of the comparators 14a–14d, imbedded logic 16a–16d, and other associated logic. To accomplish this, minor device additions to the word line select circuitry were made (i.e., the addition of transistors T6 and T8 to the word line circuit 30 in FIG. 2). The design change required was not in the access path and therefore did not effect the performance of the BAT registers 11a–11d in any way.

Figure 3:
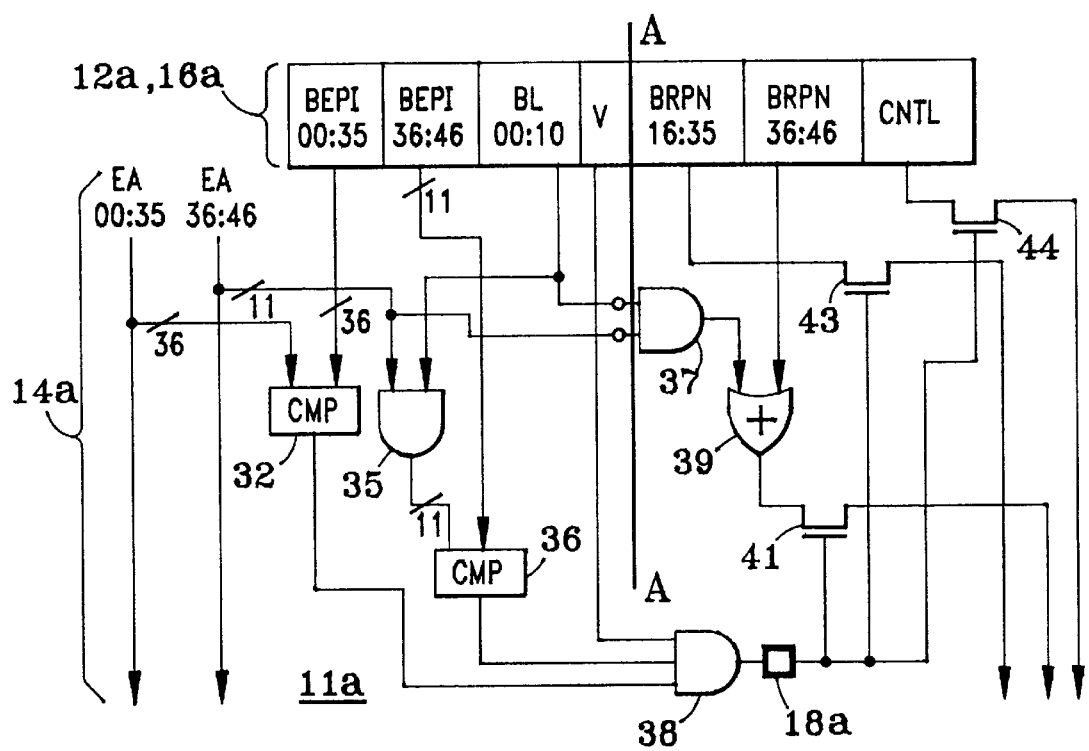
FIG. 3 discloses a detailed view of a BAT register configuration.

FIG. 3 discloses a full diagram of BAT register 11a. Although only the function of BAT register 11a will be discussed, registers 11b, 11c, and 11d will function in the same manner. FIG. 3 shows the comparator logic (14a) and masking logic (16a) embedded in a memory cell register or array 12a. Address fields (BEPI), address masking bits (BL), and valid bits (V) are stored in the memory cells or elements of the memory cell register 12a. In general, an applied address is compared with a number of stored addresses in the memory cell register 12a and if one of the stored addresses matches, then a corresponding stored address is read out. In most cases, comparators are not the only logical blocks associated with these register cells. Usually validation logic V is associated with each word line or bit line that feeds the comparators. Validation logic is logic that is used to invalidate an entry.

The left side of line A—A in FIG. 3 is tested with built-in-self-testing (BIST) and the right side of line A—A in FIG. 3 is tested with Level Sensitive Scan Design (LSSD) patterns. The box labeled 18a in FIG. 3 is one of the four observable latches (18a–18d in FIG. 1) which will capture the data to compress for the test of the CAM portion of the BAT register 11a. The four observable latches 18a–18d will use the captured data in LSSD testing to inject data to test the remaining logic associated with the right side of line A—A. Therefore, the observable latches will drive the remaining logic associated with the right side of line A—A. The outputs of the right side of line A—A will go to additional logic which is downstream and the results of which are latched in additional scannable observable latches (not shown) for testing.

As was noted above, in this embodiment the parallel testing of the present invention is performed on data from the four registers 11a–11d at the same time. Accordingly, in FIG. 3 address bus EA 00:35 and address bus EA 36:46 provide data to the BAT register 11a (as well as to BAT registers 11b, 11c, and 11d which are not shown in FIG. 3). The compare logic 14a includes comparator 32 which receives address bus EA 00:35 and address field BEPI 00:35 from the memory cell register 12a and performs a bit-by-bit comparison of the two address fields presented thereupon. If there is a match, the comparator 32 sends a high signal to AND gate 38. Eleven AND gates 35 compare address bus EA 36:46 and address masking bits BL 00:10. Accordingly, when the address masking bits BL 00:10 are high it will enable the AND gates 35. The output of the AND gates 35 are compared to the output of address field BEPI 36:46 at the comparator 36. The left side of line A—A illustrates the logical function of the comparator logic (14a in FIG. 1) which includes, for example purposes, imbedded logic (16a) to disable bits BEPI 36:46 in the compare 36 using address masking bits BL 00:10 in addition to invalidating all the inputs with the validation bit V logic. The results of 32, 36, and validation bit V present their output to AND gate 38. Since the comparators 32 and 36 will both present a high logic level if both inputs are the same and a low logic level if the inputs differ, the output of an AND gate 38 will be at a high logic level only if all three of the inputs present a high logic level thereto. The output of the AND gate 38 is scanned into the observable latch 18a which is multiplexed into the path. As stated above, the observable latch 18a will be compared to an expected value to see if there is match. The output of the observable latch 18a will drive the remaining logic associated with the right side of line A—A.

The right side of line A—A shows memory cells BRPN 16:35 and BRPN 36:46. If an entry of the BAT register matches the applied address, then the corresponding stored CNTL bits and BRPN 16:35 are read out. Some additional logic is performed on the contents of BRPN 36:46, the result of which is read out if there is a match. Address bus EA 36:46 is connected to AND gates 37. The other inputs to AND gates 37 are mask lines from the address masking bits BL 00:10. The output of the AND gates 37 are tied to OR gates 39. OR gates 39 are also coupled with address fields BRPN 36:46. The output of OR gate 39 connects to the source of transistor 41. The gate of the transistor 41 is coupled to the output of AND gate 38 and the drain of transistor 41 is connected to the output. Address fields BRPN 16:35 are tied to the source of transistor 43. The gate of transistor 43 is coupled to the output of AND gate 38 and its drain is connected to the output. The control bit, CNTL, is coupled to transistor 44. The gate of transistor 44 is also tied to AND gate 38 and the drain of transistor 44 is connected to the output. The outputs are all enabled by the output of the observable latch 18a. When the output of the observable latch 18a is high, the transistors 41,43, and 44 will turn on and the output will be enabled. As stated previously, the output of the right side of line A—A may tested using observable latches (not shown) located downstream.

The concept described above can be expanded to be used in a large number of memories/logic combinations including Static Random Access Memory (SRAM) MACROs. Further examples of these memory/logic combination arrays include the Segment Lookaside Buffer (SLB) and the Directory array. An SLB is an array that is used in a memory management unit on a processor chip. A director array is a memory array that stores addresses for other arrays. The ability to read and write to the memory portions of these different blocks is a testing requirement, thus allowing the memory portion to be tested with Array Built-In-Self-Test (ABIST) for testing memory cells. The comparator logic, on the other hand, must be tested with a Logic Built-In-Self-Test (LBIST) for testing random logic or some type of Level-Sensitive Scan Design (LSSD) testing that can handle sequential logic. In the case of the BAT and SLB, the different word lines feed separate groups of comparators and in the case of the Directory array, the bit address locations feed different groups of comparator logic. By using conventional means to test the logic, the same test patterns would have to be applied for the number of word lines or bit lines associated with the replicated parallel logic being tested. For example, the BAT registers have four word lines and therefore four 48 bit wide comparators would have to be tested one at a time selecting one word line at a time.

As previously stated, in most cases comparators are not the only logical blocks associated with these register cells. Usually validation logic is associated with each word line or bit line that feeds the comparators. This suggests that any type of logic whose inputs come from a writable memory location, can be tested in a similar parallel manner to save tester time. The only requirement being that each block of logic has an output to an observation latch. Along the same line, the logic does not even have to be identical. If the logic is identical, a more deterministic pattern could be used, but for non-identical blocks of logic, a pseudo-random number generator can be used to supply data. Each output could then be analyzed accordingly.

In accordance with the present invention, simulation analysis has shown that the same write driver that normally writes to only one word line, can be used to write to all four CAM word lines in question without any overall performance degradation. This is the case because the additional capacitance that is seen with the word lines on is only the inside of all the cells, which are small to begin with. Therefore, the additional load does not impact the signal greatly. This may not be the case for all instances, however, further analysis has shown that writing eight or even sixteen cells at a time with this same size driver is possible at the performance in question. All the analysis done so far has been at performance speeds, however not all chips are tested at performance speeds. If the cycle on chip is tested is slower than functional speeds, the allowable driving loads in this test mode could very well be greater.

The present invention shows that turning on the paths to multiple word or bit lines, a tester or a BIST can be used to test multiple groups of comparator and/or mixed logic associated with a memory. This technique lends itself to either LBIST or LSSD approach through use of the scan chain of scannable latches 10. Implementing this technique has the potential of reducing tester time without sacrificing test coverage and therefore save money.

Conventional means of testing this logic can only test one block of logic at a time, if at all, thus requiring a replicated test pattern for each block of logic. This in turn increases the tester time by a factor of the number of logic blocks to be tested. Conventional means would also prefer the memory elements feeding these logic blocks be designed to be scannable so that they can all be tested at the same time. The preference of scan latches as memory cells creates a large area concern. In today's circuits products, area, power and performance are three of the major issues. In order to comply with these issues, designers are attempting to find better and faster ways to obtain the maximum coverage for this changing technology.

The present invention makes the memory elements transparent from a logic point of view. By activating all the wordlines, data from scan chain 10 writes through the memory elements to test embedded logic driven by the memory elements. Once the embedded logic is tested, standard ABIST testing can be used to test the memory elements.

The present invention allows for the testing of multiple logic blocks associated with different memory or column locations at the same time. This technique allows for reduction in test time by a factor of X, where X is the number of rows or columns or memory cells feeding logic.

Although the present invention has been described above in specific terms, the description should be regarded as illustrative rather than limitative. Thus, workers of ordinary skill in the art will appreciate that the invention may be otherwise practiced, but that such alternative modes are encompassed by the terms of the following claims and equivalents thereto.

We claim:

1. A method of parallel testing a plurality of logic circuits embedded in a memory array in an integrated circuit, comprising:

providing a test pattern;

simultaneously writing the entire test pattern in parallel into each of a plurality of memory cells in the memory array, wherein the same test pattern is simultaneously written into all of the plurality of memory cells;

accessing the test patterns stored in the memory cells;

applying the accessed test patterns to the logic circuits embedded in the memory array to obtain test outputs; and comparing the test outputs to expected values to test the logic circuits embedded in the memory array.

2. The method of claim 1, wherein the memory array is a non-scannable memory.

3. The method of claim 1, wherein the array is to be selected from one of a BAT (block address translation buffer), SLB (segment lookaside buffer), or directory array.

4. The method of claim 1, wherein the plurality of logic circuits are used to mask and unmask memory cells in the memory array.

5. The method of claim 1, wherein the plurality of logic circuits are used to provide validation logic.

6. The method of claim 1, wherein scannable latches are used to write the test pattern into the plurality of logic circuits.

7. A method of parallel testing a plurality of logic circuits embedded in a memory array in an integrated circuit, comprising:

simultaneously turning on a plurality of word lines in the memory array;

providing a test pattern;

simultaneously writing the entire test pattern in parallel into each of a plurality of memory cells associated with the plurality of word lines, wherein the same test pattern is simultaneously written into all of the plurality of memory cells;

accessing the test patterns stored in the plurality of memory cells;

applying the accessed test patterns to the logic circuits embedded in the memory array to obtain test outputs; and comparing the test outputs to expected values to test the logic circuits embedded in the memory array.

8. The method of claim 7, wherein the test pattern is written using a plurality of scannable latches.

9. The method of claim 7, wherein the memory array is a non-scannable array.

10. The method of claim 7, wherein the comparing step uses a plurality of observable latches.

11. The method of claim 10, wherein the observable latches store a plurality of test mode outputs.

12. The method of claim 7, wherein the plurality of word lines are turned on by a test enabling signal.

13. An integrated circuit comprising:

a memory array having a plurality of logic circuits embedded therein;

a system for simultaneously turning on a plurality of word lines in the memory array;

a system for providing a test pattern;

a system for simultaneously writing the entire test pattern in parallel into each of a plurality of memory cells associated with the plurality of word lines, wherein the same test pattern is simultaneously written into all of the plurality of memory cells; and a system for accessing the test patterns stored in the plurality of memory cells, for applying the accessed test patterns to the logic circuits embedded in the memory array to obtain test outputs, and for comparing the test outputs to expected values to test the logic circuits embedded in the memory array.

14. The integrated circuit according to claim 13, wherein the memory array is a non-scannable memory.

* * * * *